United States Patent
Seefeldt et al.

(10) Patent No.: US 8,390,352 B2
(45) Date of Patent: Mar. 5, 2013

(54) APPARATUS AND METHOD FOR COMPENSATING FOR PROCESS, VOLTAGE, AND TEMPERATURE VARIATION OF THE TIME DELAY OF A DIGITAL DELAY LINE

(75) Inventors: James Seefeldt, Eden Prairie, MN (US); Xiaoxin Feng, Shakopee, MN (US); Weston Roper, Shakopee, MN (US)

(73) Assignee: Honeywell International Inc., Morristown, NJ (US)

( * ) Notice: Subject to any disclaimer, the term of this patent is extended or adjusted under 35 U.S.C. 154(b) by 147 days.

(21) Appl. No.: 12/418,981

(22) Filed: Apr. 6, 2009

(65) Prior Publication Data
US 2010/0253406 A1    Oct. 7, 2010

(51) Int. Cl.
*H03L 7/00* (2006.01)
(52) U.S. Cl. ......... 327/161; 327/149; 327/153; 327/158
(58) Field of Classification Search .................. 327/141, 327/144–163, 261–264, 269, 270, 276–278, 327/116, 119–122, 355–361; 331/1/A, 15–17; 375/373–376; 377/47, 48
See application file for complete search history.

(56) References Cited

U.S. PATENT DOCUMENTS

| | | | |
|---|---|---|---|
| 4,639,688 A | | 1/1987 | Hopwood et al. |
| 4,806,804 A | * | 2/1989 | O'Leary ........................ 327/277 |
| 4,845,388 A | | 7/1989 | Amatangelo |
| 4,847,870 A | | 7/1989 | Butcher |
| 5,021,684 A | | 6/1991 | Ahuja et al. |
| 5,101,117 A | * | 3/1992 | Johnson et al. ................ 327/149 |
| 5,666,322 A | | 9/1997 | Conkle |
| 5,801,559 A | * | 9/1998 | Sawai et al. ..................... 327/116 |
| 5,963,071 A | | 10/1999 | Dowlatabadi |
| 6,091,271 A | * | 7/2000 | Pant et al. ....................... 327/122 |
| 6,121,826 A | * | 9/2000 | Dosho et al. ................... 327/553 |

(Continued)

FOREIGN PATENT DOCUMENTS

EP    0447219 A2    9/1991

OTHER PUBLICATIONS

Jovanovic et al., "Linear Current Starved Delay Element", International Scientific Conference on Information Communication and Energy Systems and Technologies (ICEST), Jun. 2005, available at http://es.elfak.ni.ac.yu/Papers/JovanovicStojcevKrstic_DLLwithLinearDelayElement.pdf (last visited Feb. 28, 2009).

(Continued)

*Primary Examiner* — Lincoln Donovan
*Assistant Examiner* — Brandon S Cole
(74) *Attorney, Agent, or Firm* — Shumaker & Sieffert, P.A.

(57) ABSTRACT

A process, voltage, and temperature (PVT) compensation circuit and a method of continuously generating a delay measure are provided. The compensation circuit includes two delay lines, each delay line providing a delay output. The two delay lines may each include a number of delay elements, which in turn may include one or more current-starved inverters. The number of delay lines may differ between the two delay lines. The delay outputs are provided to a combining circuit that determines an offset pulse based on the two delay outputs and then averages the voltage of the offset pulse to determine a delay measure. The delay measure may be one or more currents or voltages indicating an amount of PVT compensation to apply to input or output signals of an application circuit, such as a memory-bus driver, dynamic random access memory (DRAM), a synchronous DRAM, a processor or other clocked circuit.

18 Claims, 10 Drawing Sheets

U.S. PATENT DOCUMENTS

| | | |
|---|---|---|
| 6,288,587 B1 | 9/2001 | Chen et al. |
| 6,377,103 B1 | 4/2002 | Mooney et al. |
| 6,476,656 B2 | 11/2002 | Dally et al. |
| 6,581,017 B2 | 6/2003 | Zumkehr |
| 6,741,522 B1 | 5/2004 | Lin |
| 6,747,500 B2 | 6/2004 | Mawet |
| 6,825,644 B2 * | 11/2004 | Kernahan et al. ............. 323/283 |
| 6,918,048 B2 | 7/2005 | Zumkehr |
| 6,940,768 B2 | 9/2005 | Dahlberg et al. |
| 7,015,740 B1 | 3/2006 | Feinberg et al. |
| 7,038,517 B2 * | 5/2006 | Millar ........................... 327/236 |
| 7,178,048 B2 | 2/2007 | Smith et al. |
| 7,203,875 B2 | 4/2007 | Syed |
| 7,222,036 B1 | 5/2007 | Thorne |
| 7,388,419 B2 | 6/2008 | Gk et al. |
| 7,433,262 B2 | 10/2008 | Vergnes et al. |
| 2003/0001650 A1 * | 1/2003 | Cao et al. ...................... 327/277 |
| 2005/0122144 A1 * | 6/2005 | Millar ........................... 327/141 |
| 2006/0017510 A1 | 1/2006 | Momii et al. |
| 2006/0256911 A1 * | 11/2006 | Rosik et al. .................. 375/376 |
| 2007/0247203 A1 * | 10/2007 | Cho et al. ...................... 327/175 |
| 2010/0052751 A1 * | 3/2010 | Abe ............................... 327/158 |
| 2010/0090735 A1 * | 4/2010 | Cho ............................... 327/158 |

OTHER PUBLICATIONS

R. Foglio et al. "Design and Performances of a Compensated Mean Timer", available at http://lpsc.in2p3.fr/electronique/microelectronique/meantimer.pdf (last visited Feb. 28, 2009).

Buckwalter et al., "An Active Analog Delay and the Delay Reference Loop," IEEE, Jun. 2004, 4 pages.

\* cited by examiner

US 8,390,352 B2

APPARATUS AND METHOD FOR COMPENSATING FOR PROCESS, VOLTAGE, AND TEMPERATURE VARIATION OF THE TIME DELAY OF A DIGITAL DELAY LINE

GOVERNMENT LICENSE RIGHTS

The U.S. Government has certain rights to this invention under Contract No. NNJ06TA25C (Subcontract No. RH6-118204) awarded by NASA Johnson Space Center.

FIELD OF THE INVENTION

This invention relates to electrical circuitry and electronics circuitry generally, and specifically to circuits designed for compensating for process, voltage, and/or temperature (PVT) variations in digital delay lines.

BACKGROUND

In a variety of electronic circuits, such as dynamic random access memories (DRAMs), the amount of delay through the circuit is a critical parameter. However, the amount of delay may vary due to process and/or environmental variations. Process variations include differences in chip/wafer fabrication between wafers and within a given wafer. Process variations may also arise due to environmental changes that affect a circuit once fabricated, such the effects of ionizing radiation on a given circuit.

Circuit performance may vary based on temperature as well. For example, transistors used in integrated circuits, such as Complementary Metal Oxide Semiconductor (CMOS) integrated circuits, typically have a threshold voltage with a negative temperature coefficient. That is, training or learning of the transistor decreases as the temperature increases. Also, drain current for transistors in the circuit may increase as temperature increases as well. These effects on circuit components may affect the delay of signals passing through the circuit. In addition, changes in voltage may affect the performance of a given circuit as well.

Typically, any compensation for process, voltage, or temperature (PVT) compensation of an electronic circuit applied using a training or learning cycle, such as described in U.S. Pat. No. 7,388,419. During the training cycle, a compensation device generates test patterns (e.g., patterns of 0's and/or 1's) and sends the test patterns to an application circuit. The application circuit receives the input test patterns and generates corresponding output patterns. The compensation device then determines phase differences between the input test patterns and the output patterns and sends calibration signals based on the determined phase differences.

SUMMARY

Embodiments of the present application include circuitry and methods. A first embodiment of the invention is a compensation circuit. The compensation circuit includes a first delay line, a second delay line, and a delay-measure circuit. The first delay line is configured to generate a first delay output. The first delay line includes m delay elements, where m is an integer greater than 0. The second delay line is configured to generate a second delay output. The second delay line includes m+n delay elements, where n is an integer greater than 0. The delay-measure circuit is configured to: generate an offset pulse based on the first delay output and the second delay output, and generate a delay measure based on the offset pulse.

A second embodiment of the invention is an integrated circuit. The integrated circuit includes a compensation circuit and an application circuit. The compensation circuit is configured to generate a delay measure of signals from a reference clock that has been adjusted for process, voltage, and temperature (PVT) variations. The application circuit is configured to receive the delay measure and the signals from the reference clock and to use the delay measure to adjust the signals from the reference clock.

A third embodiment of the invention is a method. A first delay output is generated. A second delay output is generated. An offset pulse is determined based on the first delay output and the second delay output. A delay measure is generated based on the offset pulse.

BRIEF DESCRIPTION OF THE DRAWINGS

Various examples of embodiments are described herein with reference to the following drawings, wherein like numerals denote like entities, in which.

DETAILED DESCRIPTION

Figure 1:
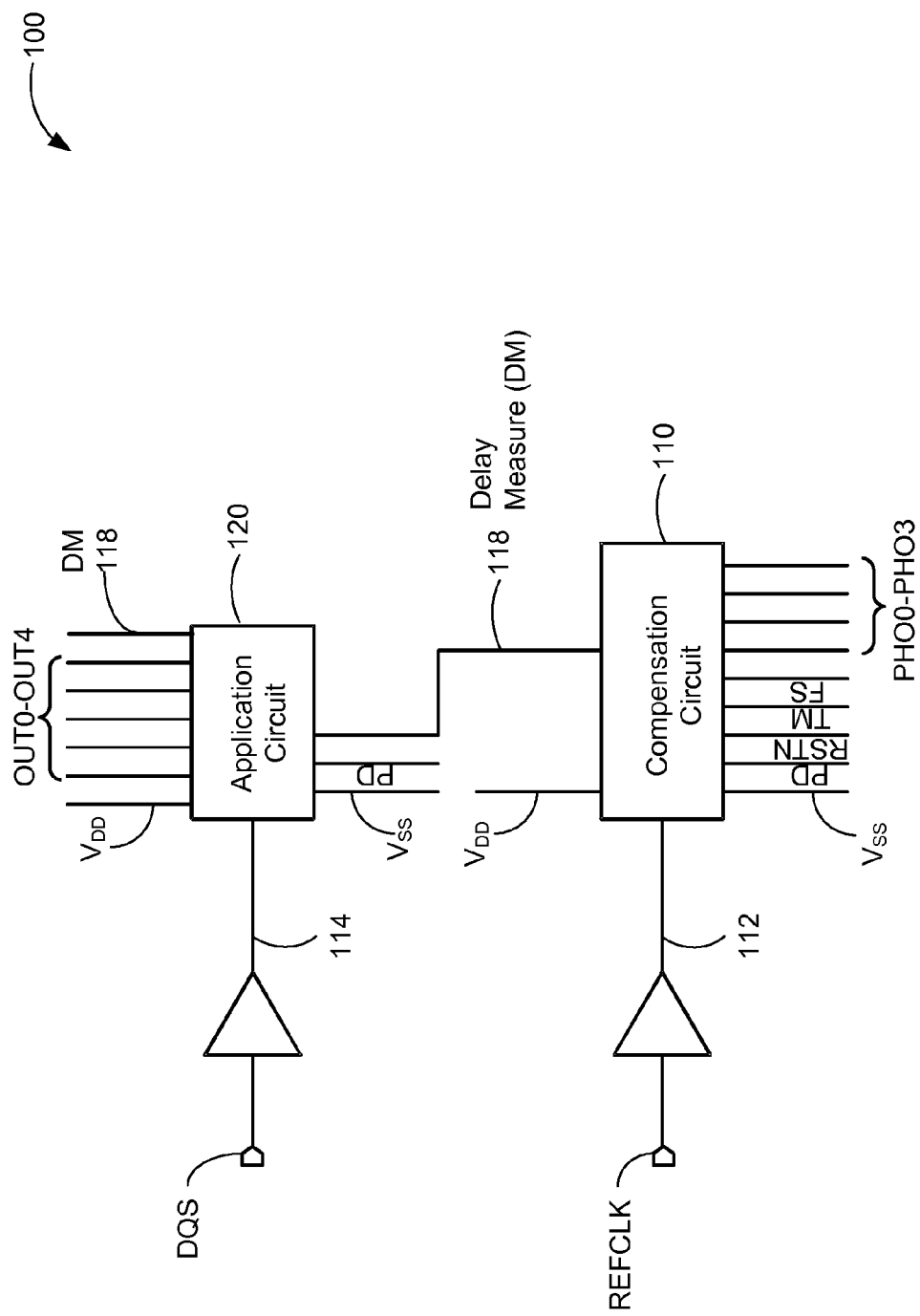
FIG. 1 is a circuit diagram of an example compensation circuit in use with an example application circuit, in accordance with embodiments of the invention.

A method and apparatus that combines signals using a compensation circuit that passes the signals through multiple delay lines to continuously compensate for process, voltage, and temperature (PVT) variations within an application circuit is disclosed. Precise timing in circuits such as Double Data Rate (DDR) DRAM interfaces require continual recalibration, by means of training or learning circuits, of the delay elements to compensate for the initial and continual process variation in addition to continual variation of the temperature and supply voltage presented to the circuit.

Clock signals, whether externally or internally provided, are used as reference signals. Clock signals in both analog and digital circuits may be derived from crystal oscillators. As such the phase and frequency of these signals are highly stable and invariant to supply voltage and temperature variation. Thus, these clock signals can be used as an absolute reference to compensate sensitive to PVT variations. The clock signals may be run through the compensation circuit that includes two delay lines. For example, a first delay line may have n components, while a second delay line may have n+m components (where n, m>0). The number of components used in a given delay line may be fixed or may be configured during operation.

The compensation circuit may then combine the signals from the two or more delay lines to determine a delay measure. The signals may first be combined using an exclusive OR (XOR) circuit. The result of XOR'ing the two or more signals may indicate offset pulses where the two or more delay lines are out of phase. The offset pulses may then be filtered to get an average offset pulse width. The average offset pulse width may be used to determine the delay measure.

The delay measure may be output by the compensation circuit for use by a given circuit to compensate for PVT variation. In particular, the delay measure may then be filtered by the compensation circuit to determine a direct current (DC) or constant voltage. The application circuit may take a current corresponding to DC voltage output from the compensation circuit and use the current as a reference for one or more delay elements, such as but not limited to, inverters (including current-starved inverters), logic gates, and/or, operational amplifiers and combinations thereof, in the application circuit to correct for PVT variations of an input clock or strobe.

The compensation circuit described herein continuously generates delay measure outputs, which may then be used by the application circuit for PVT compensation. The use of continuous delay measure generation avoids the time required for training or learning cycles used in various integrated circuits, such as DDR DRAMs and other complex circuits. As the delay measure is generated continuously, the application circuit can perform PVT compensation on an as-needed basis without having to request or wait for training cycles. Continuous compensation also allows for real-time adjustment to environmental changes, such as changes in temperature or supply. Instead, the herein-described compensation circuit may incur a slight delay (e.g., 10 µs or less) during power-up of the compensation circuit and then, while in operation, continuously provide a measure for PVT compensation to the application circuit. Further, the compensation circuit may be on the same wafer or circuit board as the application circuit. As clocks and clock pulses are widely used in electronics applications, the methods, apparatus, and techniques disclosed herein can be used in a wide variety of circuits, including but not limited to circuits implemented using CMOS, negative metal-oxide semiconductor (NMOS), and/or bipolar technologies.

An Example Compensation and Application Circuit Diagram

FIG. 1 is a circuit diagram 100 of an example compensation circuit 110 in use with an example application circuit 120, in accordance with embodiments of the invention. The compensation circuit 110 takes a reference clock (REFCLK), input and ground voltages ($V_{DD}$ and $V_{SS}$, respectively), power down (PD), reset (RSTN), test mode (TM), and frequency select (FS) signals. The reference clock signal may be any standard continuous clock signal. The power down signal, when asserted, may indicate the compensation circuit is to be shut off; preferably, the power down signal is asserted high. The reset signal may reset the compensation circuit 110; preferably a reset occurs when the reset signal is asserted low while the reference clock signal is present. The frequency select signal may indicate an operating frequency for the application circuit. For example, the compensation circuit 110 may assume the application circuit 120 is operating at a first operating frequency (e.g., 133 MHz) when the frequency select signal is asserted low and a second operating frequency (e.g., 266 MHz) when the frequency select signal is asserted high. The compensation circuit 110 can therefore handle a range of reference clock frequencies (e.g., 80 MHz to 200 MHz). The test mode signal when asserted may indicate testing of the compensation circuit to determine the phase signals described below.

The phase signals (PHO0-PHO3) may be used to select an amount of phase offset for compensation. The four phase signals may be used as bits to enable coding of a selected phase offset. For example, the four phase signals may indicate a binary "phase value" ranging from 0000 to 1111 (=a range from 0 to 15 in base 10). More or fewer phase signals may be used to determine the phase value. The phase signals PHO0-PHO3 may be used to select a reference voltage for generation, as described below in more detail with respect to FIG. 7.

Then, based on the phase value, a phase offset, a reference voltage offset may be determined. One method to determine the reference voltage offset is via a table lookup using the phase value as a key to a lookup table and then retrieving phase, frequency, and/or reference voltage offsets corresponding to the key. Other methods of determining phase, frequency and/or reference voltage offsets based on phase offset signals are possible as well.

The compensation circuit 110 outputs a delay measure 118 that is input to the application circuit 120. The delay measure 118 is a current or voltage representing a PVT-compensation value of the reference clock REFCLK 112. Determination of the delay measure is described below with respect to FIG. 3. FIG. 1 shows the application circuit 120 configured to output the delay measure 118 unchanged. Configuring the application circuit 120 to pass through the delay measure 118 permits by "daisy chaining" PVT-compensation data (i.e., the delay measure 118) through multiple application circuits.

The compensation circuit 110 is designed to adjust for wide variations in voltage and temperature. For example, in a space environment, the compensation circuit may have to compensate for input voltages that vary approximately 10% (e.g., 1.8 V±0.15V or 2.5 V±0.2V) and temperature ranges from −55° C. to 125° C. The compensation circuit 110 is designed as well to account for process variations that arise either during fabrication or operation of the application circuit. Process variations that may occur during operation include, but are not limited to, Negative Bias Temperature Instability (NBTI), Hot Carrier Interactions (HCI) and/or Total Ionizing-radiation Dose (TID) effects. Further, process variations may arise more frequently during operation in the space environment than in a terrestrial environment, due to relatively-high radiation levels in the space environment.

FIG. 1 shows an example application circuit 120 that, along with the delay measure 118, also takes input and ground voltages ($V_{DD}$ and $V_{SS}$, respectively), a power down (PD) signal, and an input DQS (data strobe) signal 114 and generates outputs OUT0-OUT4. The application circuit 120 may take the input delay measure and apply it to an input signal, such as the DQS signal 114, to generate one or more outputs OUT0-OUT4 that correspond to the DQS signal 114 as compensated for PVT variations. Each of the outputs OUT0-OUT4 may correspond to different amounts of PVT-compensation. Thus, the application circuit can apply the delay measure to (clocked) input signals to generate PVT-compensated output(s) based on the input signal and the delay measure.

The power down signal operates as described above with reference to the compensation circuit 110. The outputs OUT0-OUT4 may represent taps of the application circuit 120 with each separate output having a different delay.

The compensation circuit 110 and/or the application circuit 120 may be implemented as an integrated circuit using a variety of technologies, such as CMOS, NMOS, or bipolar technologies. The compensation circuit 110 and/or the application circuit 120 may be packaged in an application-specific integrated circuit (ASIC) and/or as a macrocell of an ASIC.

An Example Compensation Circuit

Figure 2:
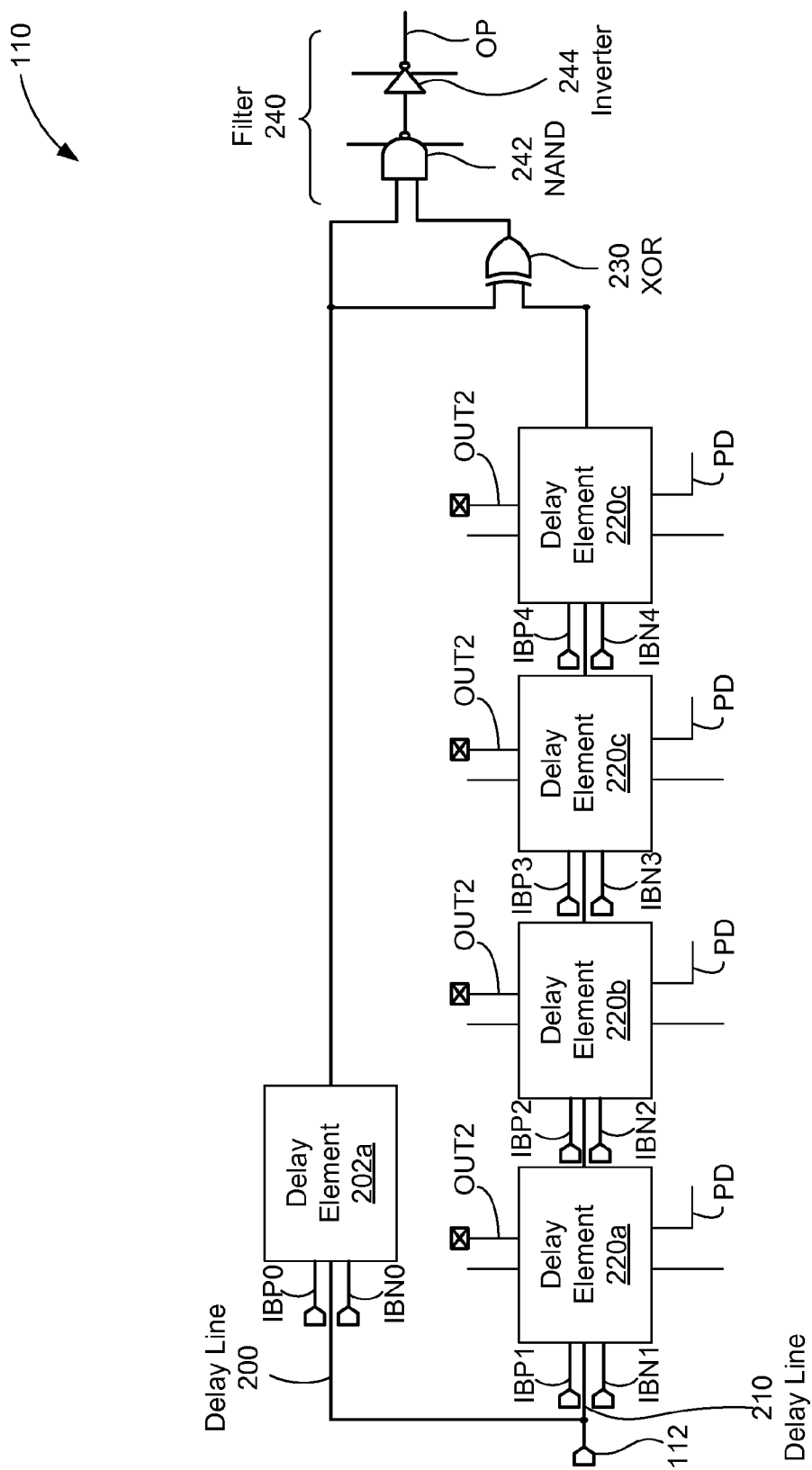
FIG. 2 is a circuit diagram showing the example compensation circuit in more detail, in accordance with embodiments of the invention.

FIG. 2 is a circuit diagram showing the example compensation circuit 110 in more detail, in accordance with embodiments of the invention. The compensation circuit 110 passes the REFCLK input 112 into two delay lines 200 and 210. Each delay line may have one or more delay elements; FIG. 2 shows a first example delay line 200 with one delay element 202a and a second example delay line 210 with four example delay elements 220a, 220b, 220c, and 220d. Each of the unlabeled lines on FIG. 2 connected to an electrical component pointing up (i.e., away from the "FIG. 2" title) may represent a $V_{DD}$ voltage input and each unlabeled line connected to an electrical component pointing down may represent a $V_{SS}$ voltage input.

More generally, the compensation circuit may have a first delay line with m delay elements (m>0) and a second delay line with m+n (n>0) delay elements. The delay measure 118 may be based on comparing pulses of REFCLK 112 passing through each of the two delay lines.

As shown in FIG. 2, all of the delay elements 202a, 220a, 220b, 220c, and 220d on both delay lines 200 and 210 may be identical; that is, they may each have identical electrical components with each of the electrical components connected in the same fashion. Example embodiments of a delay element are discussed below with respect to FIG. 3. In other embodiments, the delay elements 202a, 220a, 220b, 220c, and 220d may not be identical and/or all of the delay elements on a given delay line may be identical but may differ from the delay elements on the other delay line (i.e., the delay elements 220a, 220b, 220c, and 220d may be identical and all differ from delay element 202a). In still other embodiments, one or more of the delay elements 202a, 220a, 220b, 220c, and 220d may be replaced by one or more other electronic components, such as an operational amplifier (op-amp).

FIG. 2 shows each delay element receiving three inputs: an input pulse based on the REFCLK and two input currents IBN and IBP. Each delay element may receive different inputs; FIG. 2 shows that delay elements 202a, 220a, 220b, 220c, and 220e each receive separate IBP inputs IBP0, IBP1, IBP2, IBP3, IBP4, and IPB5, respectively, and separate IBN inputs IBN0, IBN1, IBN2, IBN3, IBN4, and IBN5, respectively. The currents input to each of the delay elements of a given delay line may or may not differ; e.g., the currents corresponding to IBP0 and IBN0 input to delay element 202a may or may not be the same as the respective IBP1 and IBN1 inputs to delay element 220a. As shown in FIG. 2, delay element 220a of delay line 210 may take REFCLK 112 as an input, and each successive delay element 220b, 220c, and 220d may take the output of the preceding delay element (220a, 220b, and 220c, respectively) as an input in place of the REFCLK 112 input of delay element 220a.

The input currents to a delay element of delay line 200 may be adjusted based on the phase offset, reference voltage offset and/or frequency offsets as indicated by the phase signals discussed above with reference to FIG. 1.

The delay measure 118 may be determined by combining and/or filtering pulses that pass or have passed through the delay lines 200 and 210. FIG. 2 shows that output pulses of both the delay lines 200 and 210 are inputs to the XOR 230.

XOR 230 performs an exclusive-or operation on its inputs to generate an offset pulse. The offset pulse may indicate where the pulse passing through delay line 200 is out of phase with the pulse passing through delay line 210.

The output of XOR 230 may be filtered by filter 240, which takes the offset pulse output of XOR 230 and the pulse from delay line 200 as inputs, NAND's these inputs together using NAND gate 242, and then inverts the output of NAND gate 242 with inverter 244 to generate a filtered offset pulse OP. Thus, filter 240 may effectively logically AND the offset pulse and the output of delay line 200.

The offset pulse OP may be input into a delay-measure circuit, such as delay-measure circuit 400 discussed below in more detail with respect to FIG. 4A, to generate the delay measure 118.

Example Delay Elements

Figure 3:
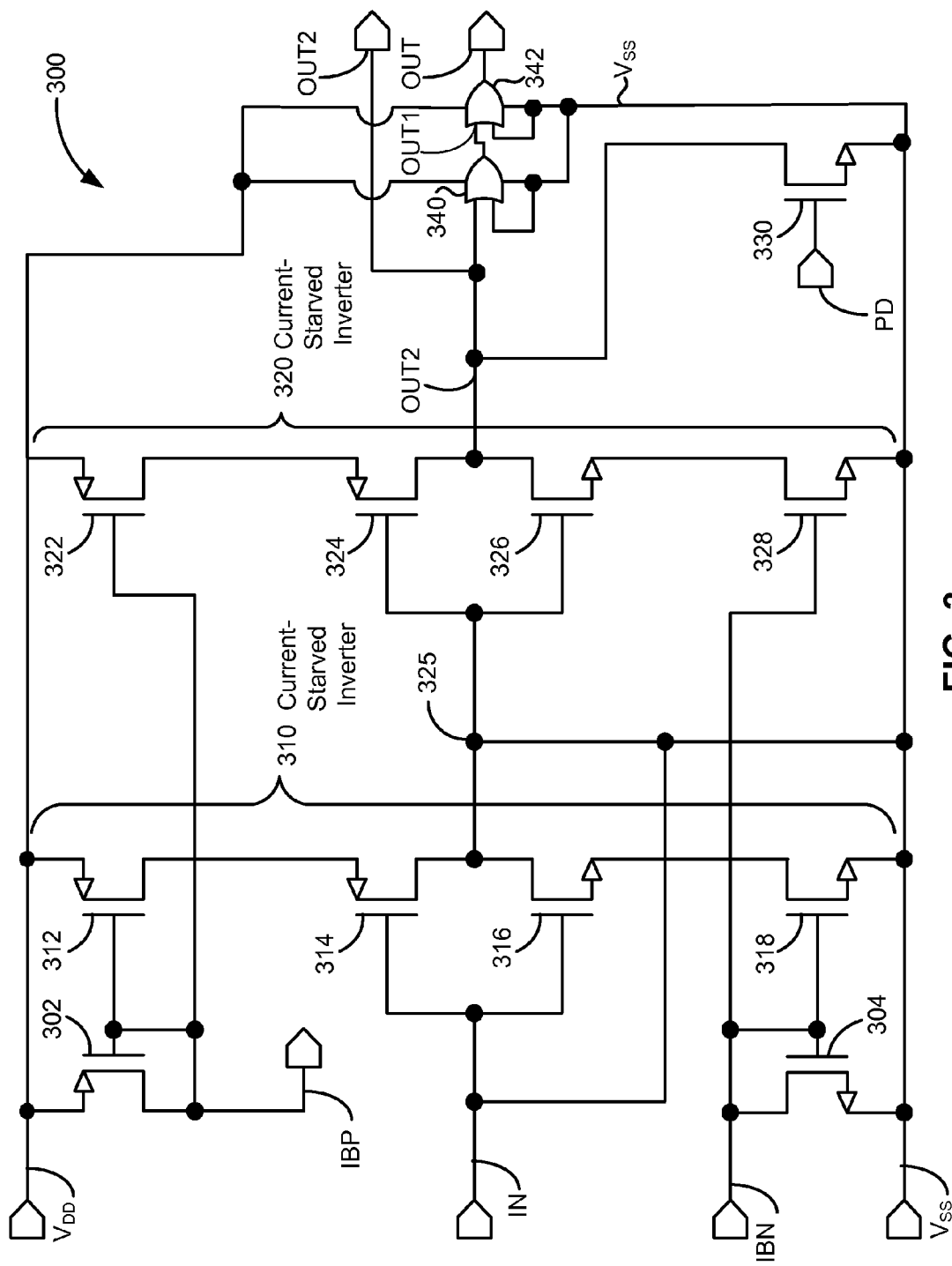
FIG. 3 is a circuit diagram showing an example delay element, in accordance with embodiments of the invention.

FIG. 3 is a circuit diagram showing an example delay element 300, in accordance with embodiments of the invention. The delay element 300 may be used as one or more of the delay elements in the compensation circuit 110 described above with respect to FIG. 2 and/or in the application circuit 120 described below with respect to FIG. 5.

FIG. 3 shows the delay element 300 receiving power ($V_{DD}$) and ground voltage ($V_{SS}$) inputs, as well as a clock input pulse (IN). Additionally, the delay element 300 receives two current inputs (IBP and IBN). IBP and IBN may be the same current inputs as IBP and IBN described above with respect to FIG. 2. The power down (PD) input operates as a power down input for the delay element 300.

FIG. 3 shows the input currents and voltages are shown as mirrored between the two identical current-starved inverters 310 and 320. Each of the current-starved inverters 310 and 320 act to both delay and invert their input signals. Along with the current inputs IBP and IBN and voltage inputs $V_{DD}$ and $V_{SS}$, current-starved inverter 310 takes input pulse IN as an input and generates an inverted and delayed copy of input pulse IN as an output (e.g., as measured at node 325). Current-starved inverter 320 takes the output of current-starved inverter 310 as an input and generates output pulse OUT2 as an output. By using two current-starved inverters in series, the logical value of the OUT2 output pulse (i.e., "0" or "1") is the same as that of input pulse IN.

FIG. 3 shows each of the current-starved inverters 310 and 320 made up of 4 transistors: 312, 314, 316, and 318 for current-starved inverter 310 and 322, 324, 326, and 328 for current-starved inverter 320. For example, current-starved mirror 310 is made up of PMOS transistors 312 and 314 and NMOS transistors 316 and 318. Transistor 312 has its source node connected to power $V_{DD}$, its gate node connected to the IBP current input, and its drain node connected to the emitter node of transistor 314. The gate nodes of both transistors 314 and 316 are connected to input signal IN and the drain nodes of transistors 314 and 316 are connected together. The source node of transistor 316 is connected to the drain node of transistor 318. The gate node of transistor 318 is connected to the IBN current input 318 and the source node of transistor 318 is connected to ground $V_{SS}$.

The current-starved inverters 310 and 320 working in conjunction with transistors 302 and 304 may adjust the amount of delay incurred by signals passing from the input pulse IN to the output pulse OUT based on the currents IBP and IBN. Transistor 302 may adjust the delay of signals passing through the current-starved inverters 310 and 320 by limiting the current the current-starved inverters 310 and 320 can generate to drive the load following the respective current-starved inverter. Similarly, transistor 304 may adjust the delay of signals passing through the current-starved inverters 310 and 320 by limiting the current the inventor each of the current-starved inverters 310 and 320 can generate to drive the load following the respective current-starved inverter.

FIG. 3 shows the output pulse OUT2 generated by current-starved inverter 320 passed on to two OR gates 340 and 342 connected in series, which act to shape output pulse OUT. OR gate 340 takes OUT2 and $V_{SS}$ (which acts as a logical "0") as logical inputs and generates output pulse OUT1. The effect of OR gate 340 is to generate OUT1 as a delayed version of OUT2 with the same logical value as OUT2. Similarly, OR gate 342 takes OUT1 and $V_{SS}$ as logical inputs and generates output pulse OUT. The effect of OR gate 342 is to generate OUT as a delayed version of OUT1 with the same logical value as OUT. Thus, output pulses OUT and OUT2 are logically equivalent to, albeit delayed, input pulse IN.

In embodiments not shown in FIG. 3, the OR gates 340 and 342 may be replaced by other components, such as but not limited to appropriately configured groups (e.g., pairs) of inverters, AND gates, NAND gates, or NOR gates to shape output pulses while ensuring the logical value of the output pulse OUT is not changed from that of output pulse OUT2.

The net effect of the delay element 300 is to generate output pulses OUT and OUT2 that each correspond to a delayed and amplified version of input pulse IN. The delay buffer 300 may provide a generally uniform skew of OUT for circuits utilizing the output pulse OUT as a clock signal.

An Example Delay-Measure Circuit

Figure 4A:
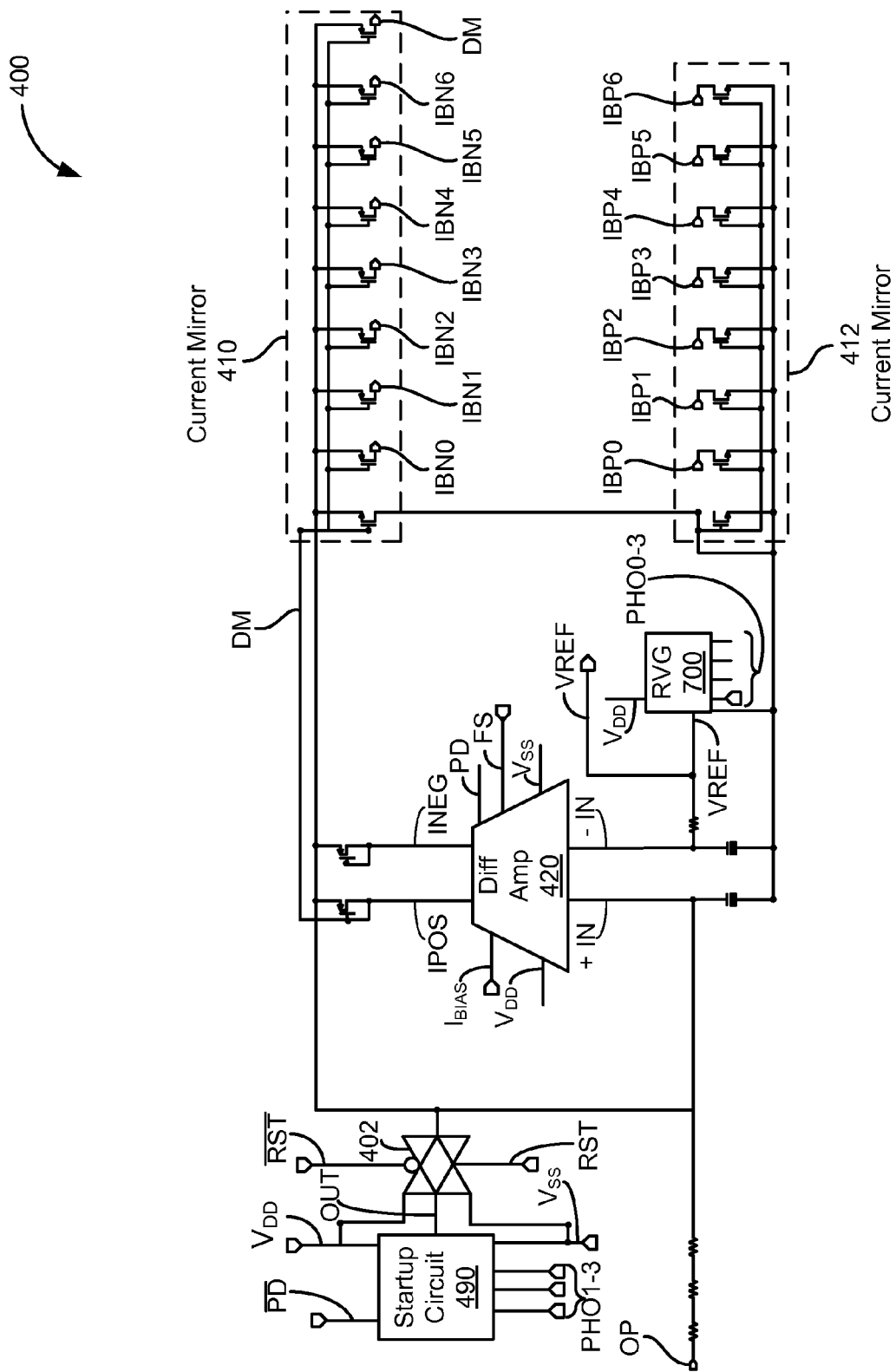
FIG. 4A is a circuit diagram showing an example delay-measure circuit, in accordance with embodiments of the invention.

FIG. 4A is a circuit diagram showing an example delay-measure circuit 400, in accordance with embodiments of the invention. While shown separately herein, the example delay-measure circuit 400 may be part of the compensation circuit 110.

The delay-measure circuit 400 takes offset pulse OP as input, such as offset pulses generated by the compensation circuit 200 described above with respect to FIG. 2, as well as bias current $I_{BIAS}$ and determines delay measure DM by using differential amplifier 420 ("Diff Amp") to average the duty cycle value of OP and scale a reference voltage VREF by the average duty cycle value. The differential amplifier 420 generates output signals IPOS and INEG from inputs +IN which is based on input signal OP, –IN which is based upon VREF, $V_{DD}$, $V_{SS}$, $I_{BIAS}$, PD, and FS. The reference-voltage generator 700 generates VREF as an output from inputs $V_{DD}$, $V_{SS}$, PHO0, PHO1, PHO2, and PHO3. The differential amplifier 420 is described below in more detail with respect to FIG. 4B and the reference-voltage generator 700 is described below in more detail with respect to FIG. 7.

The delay measure may be output either as a single output or as multiple outputs. FIG. 4A shows a current mirror 410 with 8 outputs: IBN0, IBN1, IBN2, IBN3, IBN4, IBN5, IBN6, and DM. A separate current mirror may provide corresponding taps for positive voltage inputs. FIG. 4A shows a current mirror 412 with 7 outputs: IBP0, IBP1, IBP2, IBP3, IBP4, IBP5, and IBP6. Each of the outputs IBN0-IBN6 and DM may have the same current and voltage, and each of the outputs IBP0-IBP6 may have the same current and voltage as well, while the voltage and current of outputs IBN0-IBN6 and DM may differ from the current and voltage of the outputs IBP0-IBP6. Thus the delay measure DM may be output as one or more currents. Further, the delay measure DM may be passed on to additional application circuits, permitting daisy-chaining of PVT compensation as described above with respect to FIG. 1.

Using the differential amplifier 420, the delay-measure circuit 400 may be a ratiometric circuit configured to determine an average width or duty cycle of OP by averaging the width of pulses received as input OP acting as input +IN to loop amplifier 420 relative to the reference voltage VREF acting as input –IN to loop amplifier 420.

FIG. 4A shows delay-measure circuit 400 with startup circuit 490. The startup circuit 490 may bring up the delay-measure circuit 400 after a reset and/or upon powering the delay-measure circuit. FIG. 4A shows the startup circuit 490 with $V_{DD}$, $V_{SS}$, a negated power down signal $\overline{PD}$, and PHO1, PHO2, and PHO3 signals as inputs and configured to generate an output signal OUT. The startup circuit 490 is described in more detail below with respect to FIG. 4C.

The output signal OUT of startup circuit 490 may be passed on to a transmission gate 402. The transmission gate 402 may pass the output signal OUT to the remainder of the delay-measure circuit when the RST signal is high; otherwise the output signal OUT may not be passed on to the reminder of the delay-measure circuit. Thus, the output signal OUT is only passed on when the delay-measure circuit 400 is being reset as indicated when the reset signal RST is high.

An Example Differential Amplifier

Figure 4B:
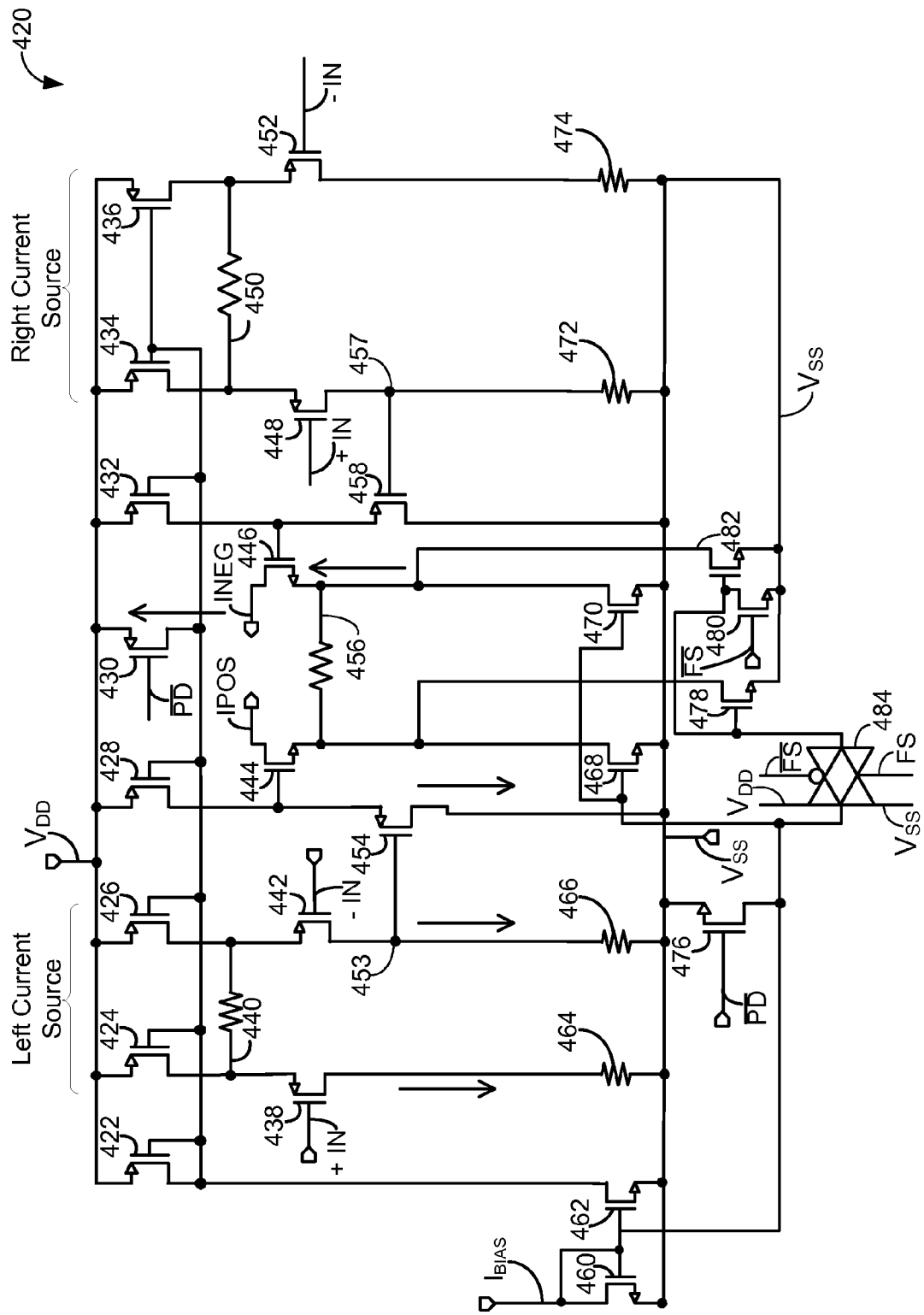
FIG. 4B is a circuit diagram showing an example differential amplifier, in accordance with embodiments of the invention.

FIG. 4B is a circuit diagram showing an example differential amplifier 420, in accordance with embodiments of the invention. The differential amplifier 420 takes the inputs and generates the outputs described above with respect to FIG. 4A. Specifically, FIG. 4B shows the +IN input passed into transistors 438 and 448 and the –IN input passed into transistors 442 and 452. The difference between the +IN input and –IN input may be multiplied by the differential amplifier 420 and provided as the IPOS and INEG outputs. The loop amplifier 420 compares the average width of the pulses of the +IN input relative to a reference voltage at the –IN input. Transistors 430 and 476 are used to implement a power down state when the power down PD signal is high.

FIG. 4B shows the differential amplifier 420 with two current sources: a left current source and a right current source. The left current source includes PMOS transistors 424, 426, 438, and 442 and resistors 440, 464, and 466. The source nodes of transistors 424 and 426 are connected to $V_{DD}$, the gate nodes of transistor 424 and 426 are connected to the $I_{BIAS}$ input, and the drain nodes of transistors 424 and 426 are both connected to resistor 440. The drain node of transistor 424 is also connected to the source node of transistor 438, the gate node of transistor 438 is connected to the +IN input and the drain node of transistor 438 is connected to resistor 464. The drain node of transistor 426 is also connected to the source node of transistor 442, the gate node of transistor 442 is connected to the –IN input and the drain node of transistor 442 is connected to resistor 466. The output of the left current source may be taken at node 453. The output of the left current source is then passed to the gate node of PMOS transistor 454. Transistor 454 may allow current to flow from the drain node output of transistor 428 toward $V_{SS}$ (and then through gate node of NMOS transistor 444) when the output of the left current source provides a current to transistor 454. The IPOS output is then at the source node of transistor 444.

Right current source is connected in a similar fashion with transistors 434, 436, 448, and 452 respectively corresponding to transistors 424, 426, 438, and 442 of left current source and resistors 450, 472, and 474 of right current source respectively corresponding to resistors 440, 464, and 466 of left current source. The output of right current source may be taken at node 457. However, as the gate node of transistor 448 receives the +IN input (as opposed to the –IN input received at the gate node of transistor 442), the output of the right current source at node 457 may depend on the +IN input (and therefore the INEG output from the source node of NMOS transistor 446) rather than the –IN input of the left current source. For example, if the −IN input and +IN inputs have reverse polarities, the IPOS and INEG outputs may also have reverse polarities.

The transmission gate 484 and transistors 460, 462, 468, 470, 478, 480, and 482 are used to implement a gain of the difference between IPOS and INEG outputs when the FS input is set high and therefore the negated FS input $\overline{FS}$ is set low. In particular, the gain may be two; that is, the difference between IPOS and INEG may be doubled when FS is set high. For example, assume the condition that FS input is set high corresponds to a doubled reference clock frequency in comparison to when the FS input is set low. Then, the differential amplifier 440 may provide a corresponding output for a base reference clock frequency when the FS input set low and a doubled output for the doubled reference clock frequency when the FS input set high.

An Example Startup Circuit

Figure 4C:
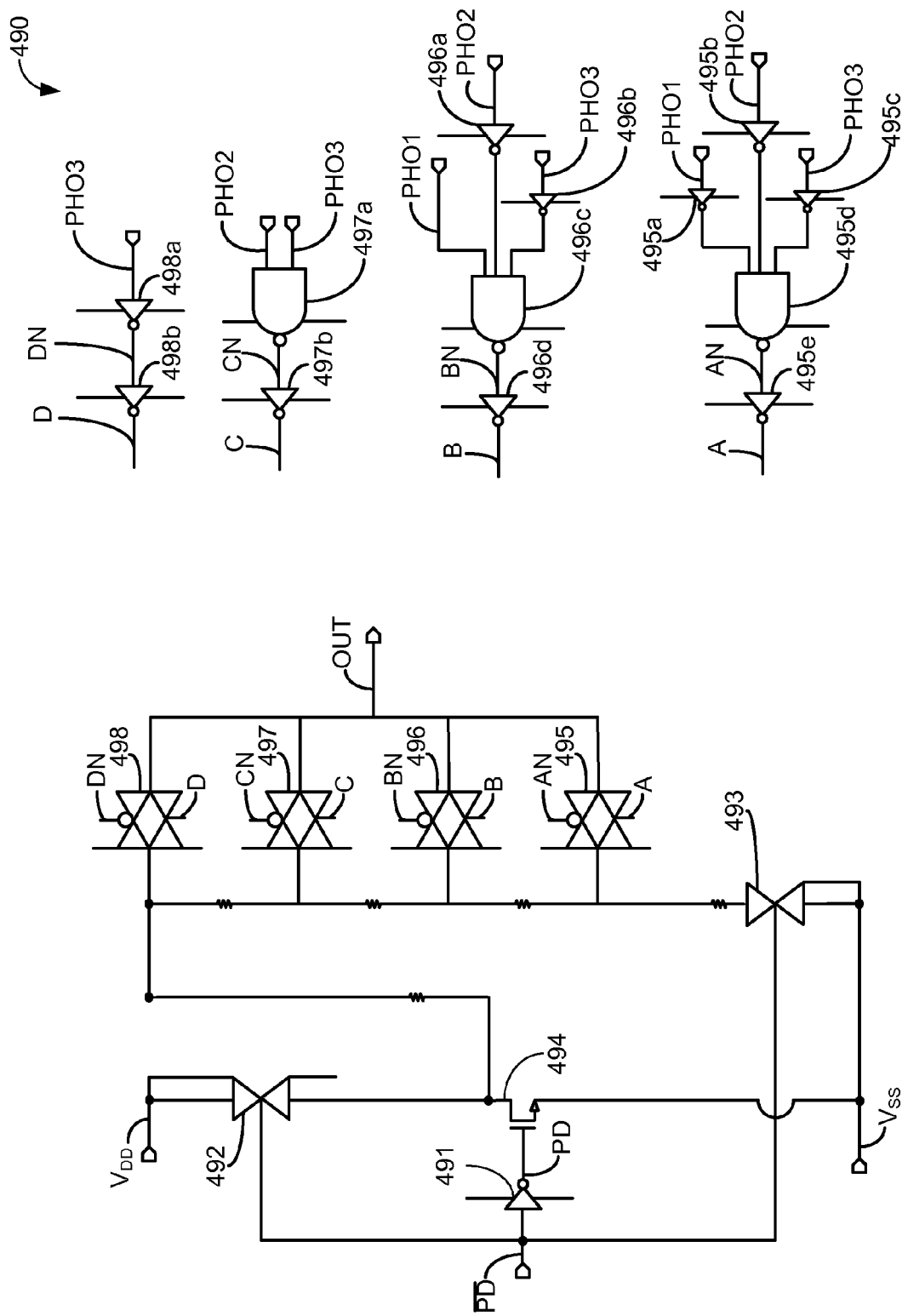
FIG. 4C is a circuit diagram showing an example startup circuit, in accordance with embodiments of the invention.

FIG. 4C is a circuit diagram showing an example startup circuit 490, in accordance with embodiments of the invention. FIG. 4C shows the startup circuit 490 with $V_{DD}$, $V_{SS}$, a negated power down signal $\overline{PD}$, and PHO1, PHO2, and PHO3 signals as inputs and configured to generate an output signal OUT. Each of the unlabeled lines on FIG. 4C connected to an electrical component pointing up (i.e., away from the "FIG. 4C" title) may represent a $V_{DD}$ voltage input and each unlabeled line connected to an electrical component pointing down may represent a $V_{SS}$ voltage input.

FIG. 4C shows the negated power down signal $\overline{PD}$ passed on to inverter 491, which then generates the non-negated power down signal PD. $\overline{PD}$ is also passed on to components 492 and 493 which permit signals to pass when $\overline{PD}$ is set high (that is, when PD is set low). The PD signal is also provided to the gate node of NPN transistor 494 which then controls current flow from input with $V_{DD}$ to $V_{SS}$ and to the remainder of the startup circuit. Thus, the output signal OUT may not be generated when PD is set high (or correspondingly when $\overline{PD}$ is set low).

FIG. 4C shows that the output signal OUT may be generated when either the A, B, C, or D inputs is logically high to permit respective transmission gates 495, 496, 497 or 498 to allow current flow. The logic shown on the right hand side of FIG. 4C may be used to generate the A, AN, B, BN, C, CN, D, and DN inputs to the transmission gates 495, 496, 497, and 498.

For inputs A and AN, FIG. 4C shows the PHO1, PHO2, and PHO3 input signals are each inverted by inverters 495a, 495b, and 495c. FIG. 4C shows the negated $\overline{PHO1}$, $\overline{PHO2}$, and $\overline{PHO3}$ input signals passed into NAND gate 495d which then generates the AN input. The AN input is then negated by inverter 495e to generate the A input. Thus, input AN may be set high and corresponding input A set low unless PHO1, PHO2, and PHO3 are set high. If PHO1, PHO2, and PHO3 are all high, though, input A may be set high and input AN may be set low. The following equations describe the A and AN inputs: A=!PHO1+!PHO2+!PHO3 and AN=!A, where ! is the logical NOT operator and + is the logical AND operator.

Similarly, components 496a, 496b, 496c, and 496d are shown in FIG. 4C to permit input B to be set high when the PHO1 input is set high and PHO2 and PHO3 inputs are set low; as an equation and input BN to be the logical negation of input B; the corresponding equations are: B=PHO1+!PHO2+!PHO3 and BN=!B. Components 497a and 497b are shown in FIG. 4C to permit input C to be set high when both inputs PHO2 and PHO3 are set high and input CN to be the logical negation of input C; the corresponding equations are: C=PHO2+PHO3 and CN=!C. Components 498a and 498b are shown in FIG. 4C to permit input D to be set high when input PHO3 is set high and input DN to be the logical negation of input D; the corresponding equations are D=PHO3 and DN=!PHO3.

The use of the PHO1, PHO2, and PHO3 inputs allows for current to be generated in various modes of the compensation circuit 110 and/or application circuit 120. In particular, a test mode may signaled using one of the combinations of the PHO1, PHO2, and PHO3 inputs that leads to generation of the OUT output being generated by the startup circuit 490 (e.g., a test mode may be signaled with PHO1 set high, PHO2 set low, and PHO3 set low to generate the B output and thus cause transmission gate 496 to allow current flow for the OUT output).

The OUT output may provide current to bias components of the delay-measure circuit 400; i.e., the OUT output may drive current mirrors 410 and 420 to generate the various IBN and IBP outputs that power the various delay elements in the compensation circuit 110 and/or the application circuit 120. Thus, while operating in a test mode, the compensation circuit 110 and/or the application circuit may be biased while awaiting for reset of other circuits, such as phase-locked loops (PLLs), that may require a relatively long period of start up time (e.g., 250 µs or more), and to therefore reduce the time required to provide PVT-compensation to a few additional percent of a total reset time budget (e.g., less than 10 additional µs, which is equivalent to adding 4% or less of a reset time budget based on a 250 µs reset for other circuitry).

An Example Application Circuit

Figure 5:
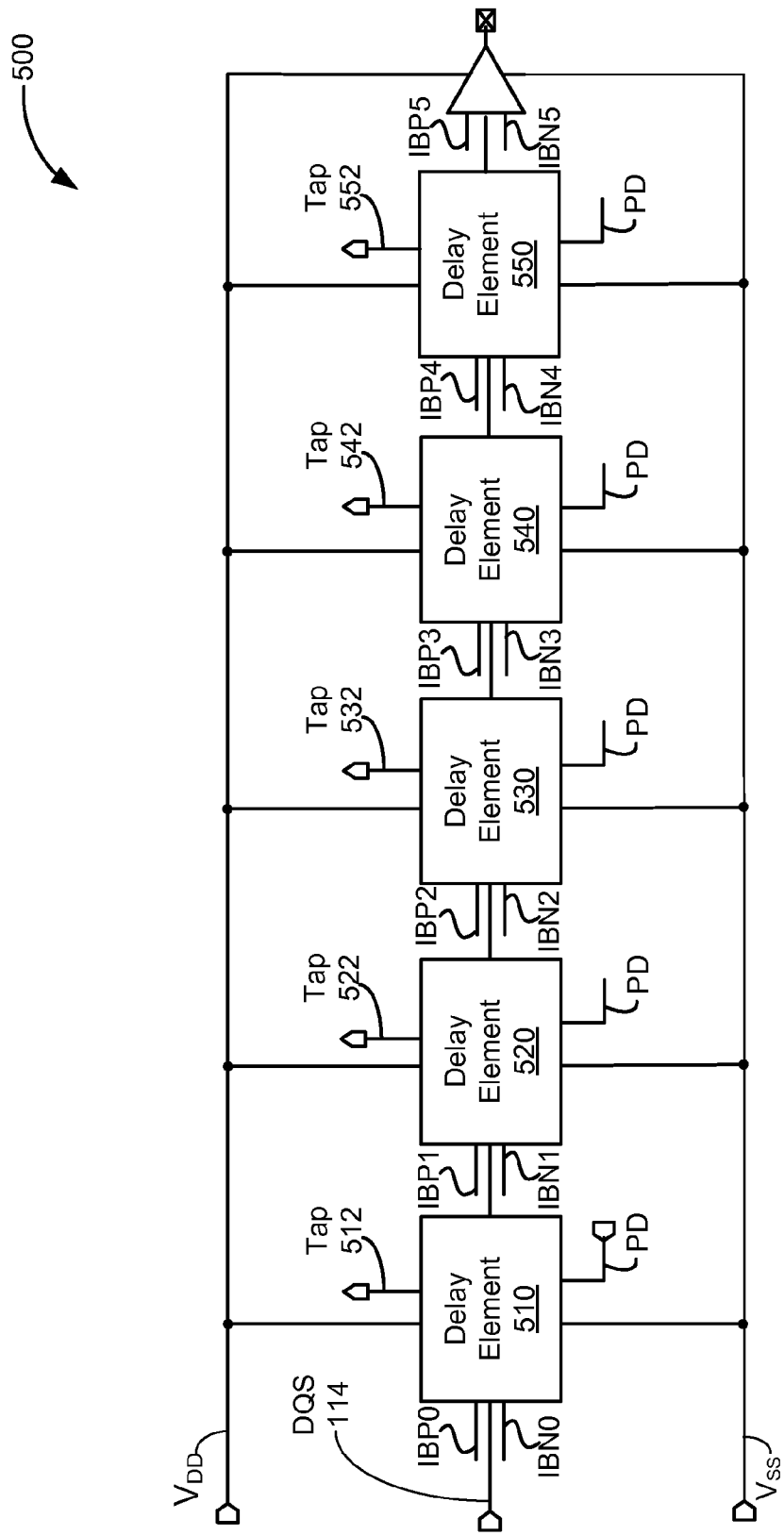
FIG. 5 is a circuit diagram showing an example application circuit, in accordance with embodiments of the invention.

FIG. 5 is a circuit diagram showing an example application circuit 500, in accordance with embodiments of the invention. The example application circuit 500 may be used to test the compensation circuit 110 and/or may take the place of application circuit 120 discussed above with respect to FIG. 1.

The example application circuit 500 receives a strobe input DQS 114. DQS 114 may represent a data strobe input. The data strobe input may have a pulse each time a memory operation, such as a read or a write operation, is to be performed. Memory operations may be timed based on rising or falling edges of the data strobe input.

FIG. 5 shows the application circuit 500 with five delay elements 510, 520, 530, 540, and 550. Example embodiments of a delay element are discussed above with respect to FIG. 3. Each delay element may receive one or more currents or voltages corresponding to the delay measure DM. FIG. 5 shows each delay element 510, 520, 530, 540, and 550 receiving two input currents: a positive current IBP0, IBP1, IBP2, IBP3, or IBP4, respectively, and a negative current IBN0, IBN1, IBN2, IBN3, or IBN4, respectively. More or fewer delay elements may be used in the application circuit 550.

These negative and positive currents may be the currents shown in FIG. 4 as generated by the current mirrors 420 and 430, respectively. As such, the negative current may explicitly represent the delay measure DM and the positive current may represent the reference voltage VREF.

FIG. 5 shows each of the delay elements 510, 520, 530, 540, and 550 as identical. In other embodiments, the delay elements 510, 520, 530, 540, and 550 may not be identical. In still other embodiments, one or more of the delay elements 510, 520, 530, 540, and 550 may be replaced by one or more other electronic components, such as an operational amplifier (op-amp).

FIG. 5 also shows the application circuit 500 with five taps: 512, 522, 532, 542, and 552. Each of the taps may be used to convey one or more outputs from the one or more delay elements; that is, taps 512, 522, 532, 542, and 552 may convey one or more outputs from delay elements 510, 520, 530, 540, and 550, respectively. In other embodiments of the invention, one or more other application circuit(s) may replace the example application circuit 120. Each of the outputs at taps 512, 522, 532, 542, and 552 may represent PVT-compensated outputs corresponding to the DQS input 114. However, each output of the outputs at taps 512, 522, 532, 542, and 552 may include a successively longer delay as part of the PVT compensation. In still other embodiments, more or fewer taps may be used in an application circuit 500 than shown in FIG. 5.

The application circuit 500 may be used as a component in a larger application circuit. For example, the larger application circuit may use the application circuit 500 as a "front end" or "back end" to PVT-compensate a respective input signal or output signal, respectively. More specifically, a DRAM may include the application circuit 500 as a front-end to PVT-compensate a DQS signal before using the compensated-data-strobe signal to operate the DRAM. Similarly, a memory controller or other device that generates data strobe signals as outputs may use the application circuit to PVT-compensate the output data strobe signals. Choice of a specific tap (i.e., a specific amount of delay) to use for the compensated-data-strobe signal may be determined at design or during operation. Many other examples of combining application circuit 500 with other application circuits are possible as well.

Many other application circuits are possible as well. Other application circuits include, but are not limited to, memory circuits (e.g., DRAMs and synchronous DRAMs (SDRAMs)), processor circuits, control circuitry, and/or driver circuits. For example, the application circuit may be a DRAM or an SDRAM, and may be configured to comply to one or more DRAM standards, such as but not limited to DDR, DDR2, and/or DDR3 standards. Further, any clocked circuit, such as but not limited to processors and control logic circuits, could readily be used as an application circuit within the spirit of this invention. Also, a memory-bus driver, such as described below with respect to FIG. 6, may be used as an application circuit as well.

An Example Memory-Bus Driver

Figure 6:
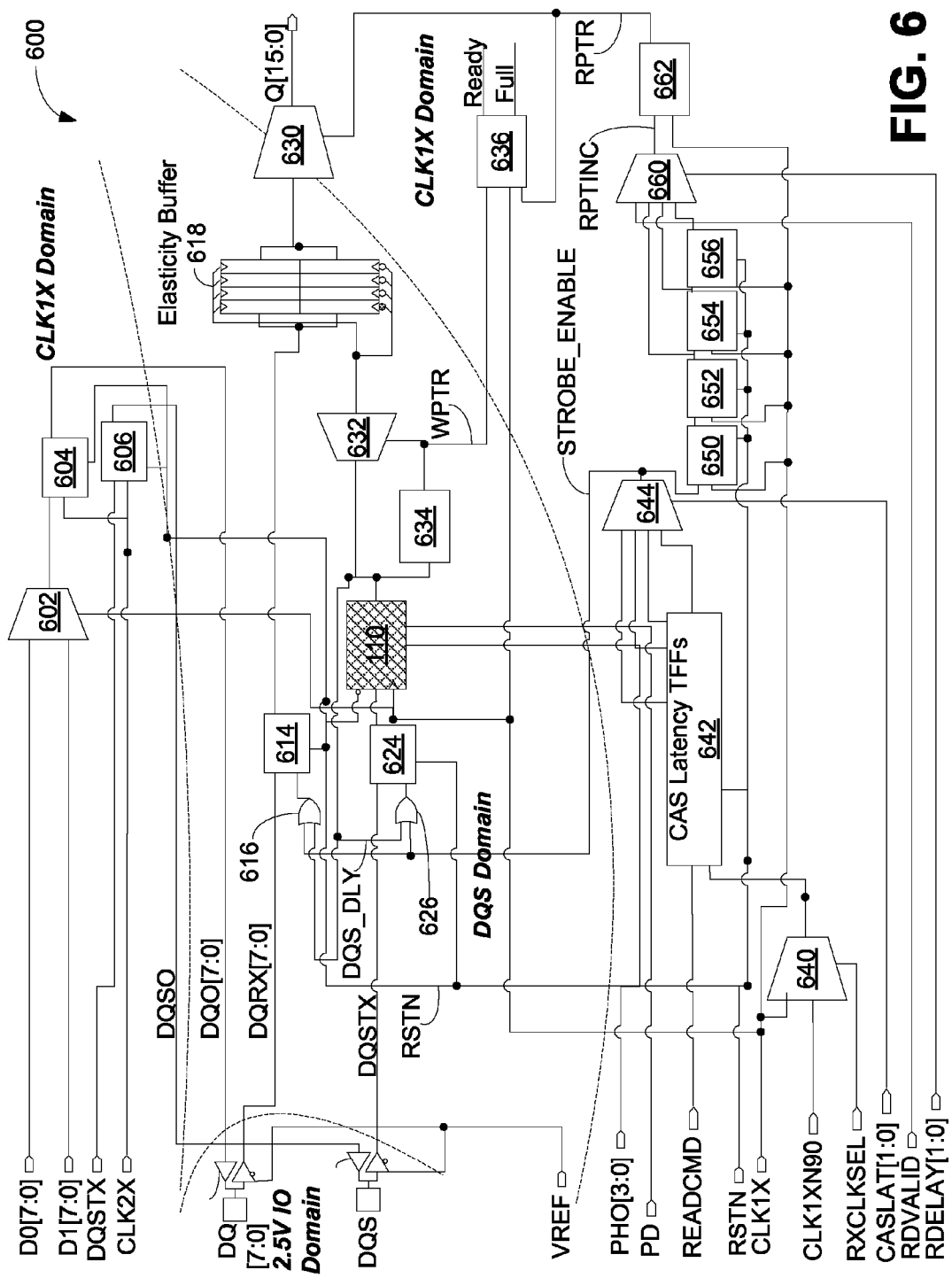
FIG. 6 is a circuit diagram showing an example memory-bus driver, in accordance with embodiments of the invention.

FIG. 6 is a memory-bus driver 600, in accordance with embodiments of the invention. The memory-bus driver 600 may be used as an application circuit as described above with respect to FIGS. 1 and 5. The memory-bus driver 600 may be used to interface with a DRAM. The DRAM may be an SDRAM, such as a DRAM configured to meet the DDR, DDR2, and/or DDR3 standards. The compensation circuit 110 is shown in the center of FIG. 6 with cross-hatching. The remainder of the circuit shown in FIG. 6 corresponds to the application circuit 120 described above in FIG. 1.

The memory-bus driver 600 is divided into two domains or regions where a particular clock signal is operative. The CLK1X domain (divided into two portions by dashed lines as shown in FIG. 6) indicates regions of the memory-bus driver where the CLK1X signal synchronizes operations. The DQS domain indicates regions of the memory-bus driver where the DQS signal synchronizes operations. The memory-bus driver may be used in association with a memory (not shown), such as a DRAM.

A number of lines may be connected to the memory-bus driver 600. The D0[7:0], D1[7:0], and DQ[7:0] lines may be data lines where the [7:0] nomenclature indicates that 8 lines are used. For example, the D0[7:0] lines includes 8 lines: D0[0], D0[1], D0[2], D0[3], D0[4], D0[5], D0[6], and D0[7]. The DQSTX line may be used as a strobe signal to indicate data is to be transmitted from the associated memory. The DQ[7:0] lines may be used to receive and/or transmit data to the memory-bus driver. The DQS line may be asserted when data is present on the DQ[7:0] lines. The VREF line may carry a reference voltage, such as described above with respect to FIG. 4 and/or as described below with respect to FIG. 6. The PHO[3:0] lines may be carry the phase signals described above with respect to FIG. 1 and below with respect to FIG. 7. The power down PD line may carry a power down signal to disable the memory-bus driver 600, such as the power down signal described above with respect to FIGS. 1 and 2.

The READCMD line may include a signal indicating if a read operation or a write operation is to be performed by the associated memory. The RSTN line may carry a reset signal such as described above with respect to FIG. 1.

The CLK1X line may carry a clock signal operating at a known frequency, such as 100 MHz or 133.33 MHz. The CLK1XN90 line may carry a signal representing a phase shifted version of the CLK1X signal, such as a 90° phase-shifted signal from the CLK1X signal. Similarly, the CLK2X line may carry a signal representing a multiplied clock signal; that is a clock signal whose frequency is a multiple of the CLK1X line, where the multiple may be two, three, or another integer number. As indicated in FIG. 6, the multiple for the CLK2X line is two. The RXCLKSEL may enable selection of a clock signal, such as selection of either the signal on the CLK1X line or the signal on the CLK1XN90 line.

The CASLAT[1:0] lines may be two lines (CASLAT[0] and CASLAT[1]) each carrying a signal indicating a column address strobe (CAS) latency amount. The RDVALID line may carry a signal indicating whether the read operation is valid. The RDELAY[1:0] (RDELAY[0] and RDELAY[1]) lines may be two lines indicating a read delay amount.

The memory-bus driver 600 may be used to control either write or read operations with the associated memory. To perform a write operation whose data arrives on data lines D0[7:0] and D1[7:0] to be written to the memory via the DQ[7:0] lines, half of the data D0/D1 lines (that is, either data lines D0[0:7] or D1[0:7]) may be selected using multiplexer (MUX) 602. The output of MUX 602 may be passed into toggle flip-flop (TFF) 604. The output of TFF 604, shown as DQO[7:0], may be sent to the associated memory via the DQ[7:0] lines. The DQSO signal may be generated based on passing a signal from the DQSTX line through TFF 606, which is then sent on the DQS line to the associated memory.

For a read operation, the DQSTX signal may be input via the DQS line, and latched using TFF 624 and then passed into the compensation circuit 110 as the frequency select (FS) signal. Similarly, the input data shown as DQRX[7:0] in FIG. 6 presented from the DQ[7:0] lines may be latched by TFF 614. The TFFs 614 and 624 may use the STROBE_ENABLE signal logically OR'd with the DQS_DLY signal via OR gates 616 and 626, respectively, as a clock signal. The DQS_DLY signal may represent the output delay measure of the compensation circuit 110. During a read operation, the input data may be stored in the elasticity buffer 618 as described above.

A specific per-operation buffer of the elasticity buffer 618 may be selected using the 1:4 MUX 632 controlled by three-bit counter 634 that is clocked using the DQS_DLY signal output from the compensation circuit 110. The output of the three-bit counter 634, shown as WPTR on FIG. 6, is also passed on to TFF 636 to generate a ready signal, indicating the elasticity buffer 618 has storage for more data, and a full signal, indicating the elasticity pointer is completely occupied. The WPTR signal may select a per-operation buffer of the elasticity buffer 618 to be output for write operations.

The selection of a specific per-operation buffer of the elasticity buffer 618 for read operations is controlled using signals on the CASLAT[1:0] lines passed into the CAS latency TFFs 642. Specifically, there may be six TFFs that make up CAS latency TFFs 642, the six TFFs connected in series, to latch signals from the READCMD line over a number of clock cycles; however, in alternate embodiments more or fewer TFFs may make up CAS latency TFFs 642. The CAS latency TFFs 642 are clocked by signals on either the CLK1X line or the CLK1XN90 line as selected using signals on the RXCLKSEL line via MUX 640. The CAS latency TFFs 642 generate four outputs, one of which is selected by the MUX 644 using the two CASLAT[1:0] lines as control signals.

The output of the MUX 644, shown in FIG. 6 as STROBE_ENABLE, is passed into the TFFs 650, 652, 654, 656, which latch the STROBE_ENABLE signal over four clock cycles. The TFFs 650, 652, 654, and 656 as well as three-bit counter 662 are clocked using signals on the CLK1X line. The outputs of TFFs 652, 654, and 656, along signals on the RDVALID line are passed into MUX 660, which generates one output as controlled by control signals from the RDELAY[1:0] lines. The output of the MUX 660, shown on FIG. 6 as RPTINC, is passed into a three-bit counter 662 which generates a signal, shown as RPTR on FIG. 6, used to control MUX 630. The RPTR signal may select a per-operation buffer of the elasticity buffer 618 to be output for read operations. Similarly, the WPTR signal may be used to select a per-operation buffer of the elasticity buffer 618

An Example Reference-Voltage Generator

Figure 7:
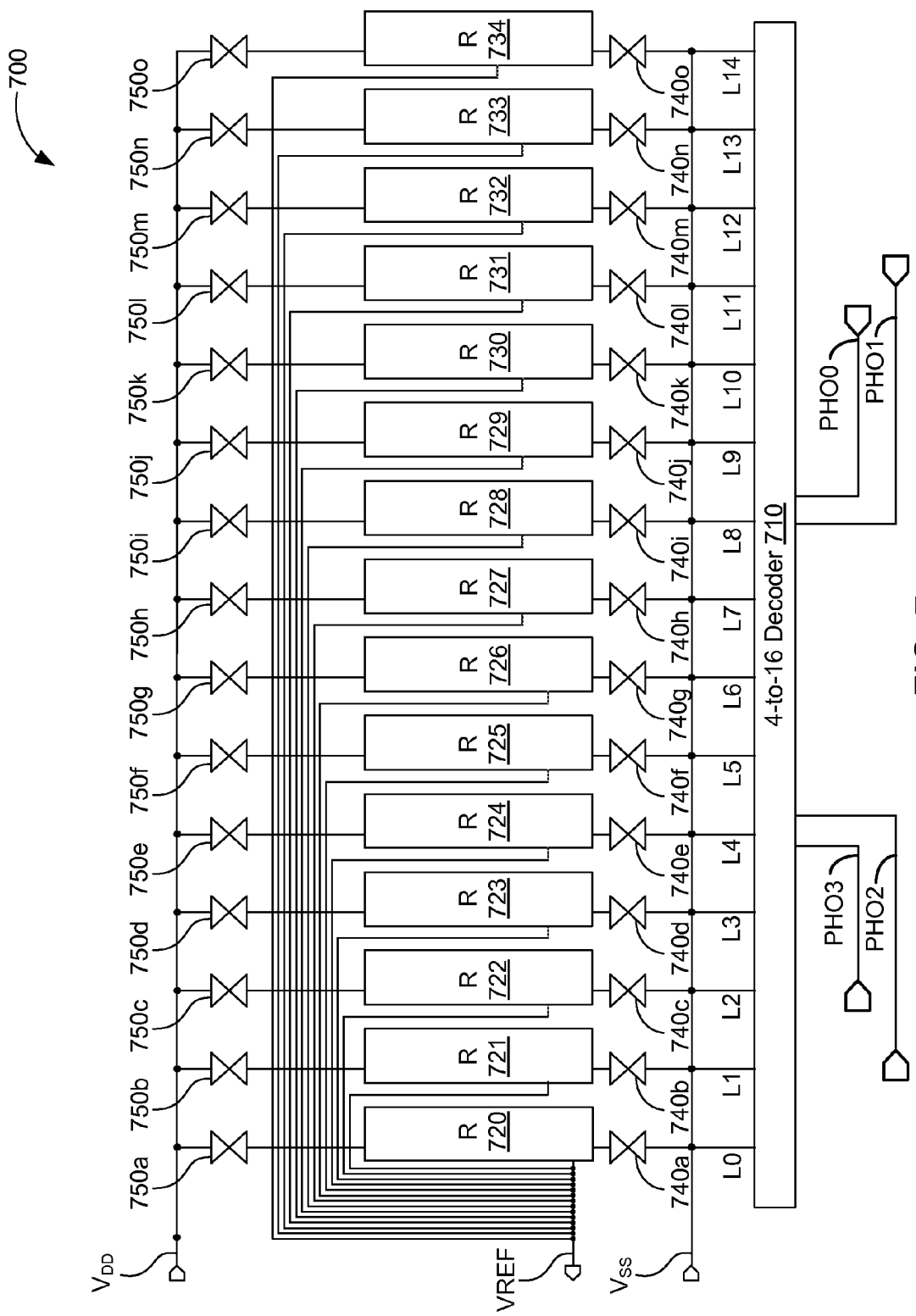
FIG. 7 is a circuit diagram showing an example circuit for generating a reference voltage, in accordance with embodiments of the invention.

FIG. 7 is a circuit diagram showing an example reference-voltage generator 700 for generating a reference voltage, in accordance with embodiments of the invention.

The example reference-voltage generator 700 takes as inputs the phase signals PHO1, PHO2, and PHO3 described above with respect to FIGS. 1 and 4A. The phase signals PHO0, PHO1, PHO2, and PHO3 may be passed into a 4-to-16 decoder 710. Only fifteen of the 16 output lines L0-L15 of the 4-to-16 decoder 710 are shown, due to space restrictions.

The phase signals may be interpreted as binary digits to indicate a particular reference voltage to be generated. For example, the signals may be processed such that PHO3 signal is interpreted as a most significant digit of a four-bit binary number, PHO2 as the second-most significant digit, PHO1 as the third-most significant digit, and PHO0 as the least significant digit (or vice versa). For example, using this interpretation of the phase signals, suppose a user of the reference-voltage generator desired to use reference voltage number 9 in base 10=1001 in base 2. The user may then set the PHO3 and PHO0 signals high (indicating binary 1 values) and set the PHO2 and PHO1 signals low (indicating binary 0 values). As another example, suppose the user desired to use reference voltage 12 in base 10=1100 in base 2. Then, to select reference voltage 12, the user may set the PHO3 and PHO2 signals high and set the PHO1 and PHO0 signals low.

The 4-to-16 decoder may activate exactly one of the output lines L0 . . . L15 based on the phase signal inputs and may deactivate the remaining output lines. For example, if the PHO3 and PHO2 signals are set high and the PHO1 and PHO0 signals are set low, output line L12 (corresponding to reference voltage 12) may be activated.

A signal on the activated line may be used to open a first corresponding transmission gate; that is one of transmission gates 740*a*-740*o* (transmission gate 740*p* not shown) and a second corresponding transmission gate 750*a*-750*o* (transmission gate 750*p* not shown). Then, a current at a known voltage, such as $V_{DD}$, may pass through a corresponding resistor R720-R734 (R735 not shown), and then through a second corresponding transmission gate 750*a*-750*o* (transmission gate 750*p* not shown), before being output as a reference voltage VREF. Each of the deactivated lines may not open their corresponding transmission gates to allow current to flow, and thus an output voltage may not be generated for each of the deactivated line. Each of the resistors R720-R735 may have a different resistance value, leading to a different reference voltage for each of the sixteen possible activated lines. Thus, the phase signals PHO0-PHO3 are used to determine one of sixteen possible reference voltage VREF outputs by the reference-voltage generator 700. More or fewer possible reference voltages may be output by the reference-voltage generator 700 based on a corresponding addition or deletion of phase signals, transmission gates, and/or resistances.

An Example Method for Compensating for PVT Variations

Figure 8:
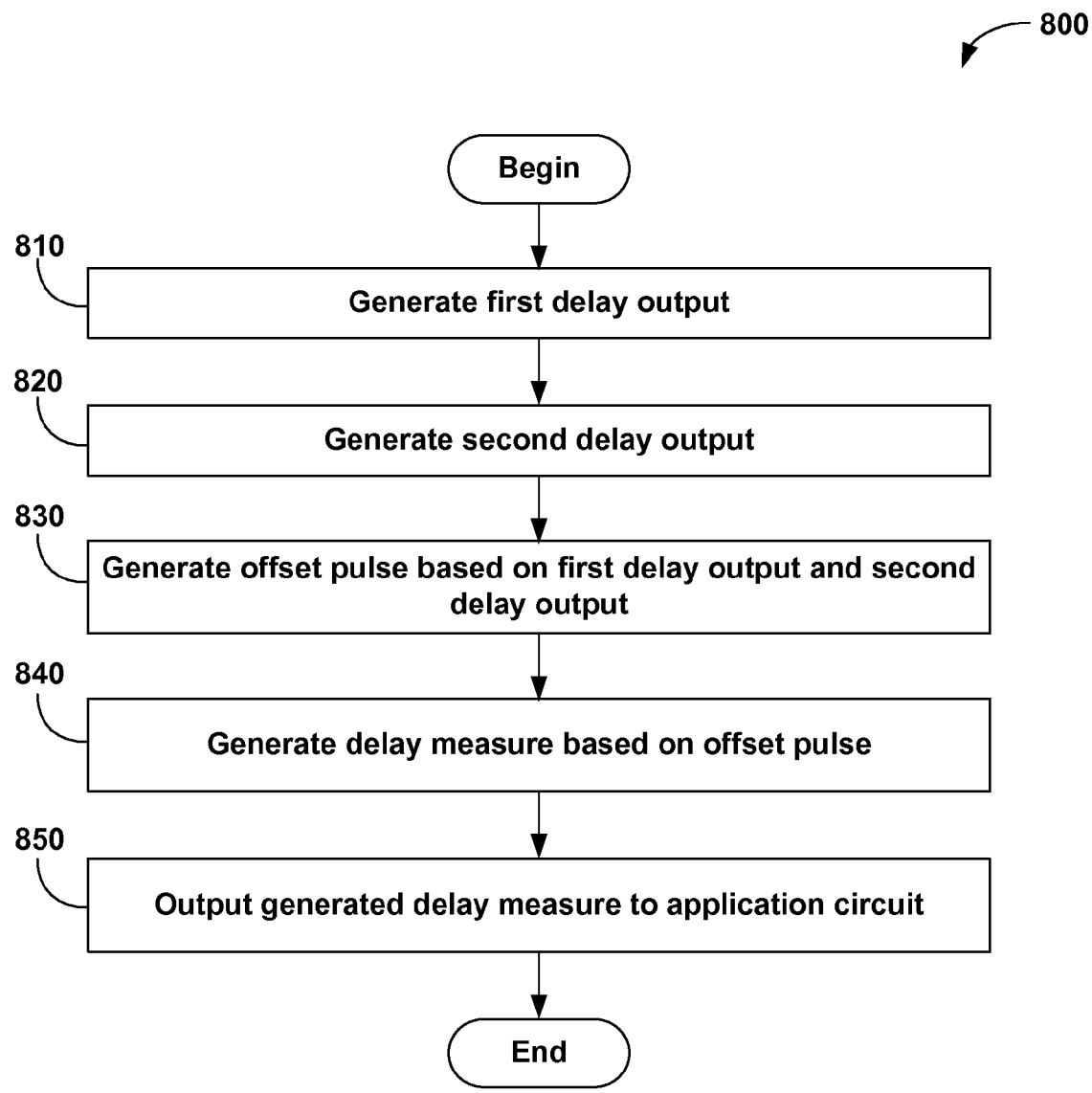
FIG. 8 is a flow chart of an example method generating a delay measure to compensate for PVT variations in an application circuit, in accordance with embodiments of the invention.

FIG. 8 is a flow chart of an example method 800 for generating a delay measure to compensate for PVT variations in an application circuit, in accordance with embodiments of the invention. It should be understood that each block in this flowchart presented herein may represent a module, segment, or combination of electronic components, perhaps executing computer firmware and/or software, for implementing specific logical functions or steps in the process. Alternate implementations are included within the scope of the example embodiments in which the blocks described herein may be executed out of order from that shown or discussed, including substantially concurrently or in reverse order, depending on the functionality involved, as would be understood by those reasonably skilled in the art of the described embodiments.

Method 800 begins at block 810. At block 810, a first delay output is generated. The first delay output may be generated by a first delay line. The first delay line may include m delay elements, where m is an integer greater than 0. The m delay elements may be connected together to form the delay line. Also, each of the m delay elements may be identical, such as each being delay elements as shown in FIG. 3 or delay buffers as shown in FIG. 4.

The first delay line may accept one or more inputs. The inputs may include power VDD and ground VSS voltages as well as a reference clock input. Also, the inputs may include one or more input currents, such as IBP and IBN discussed above with respect to FIGS. 3 and 4. While each of the delay elements of the first delay line may be identical as discussed above, each delay element may receive different inputs, such as receiving different input currents and/or different reference clock inputs. Also, some inputs, such as the voltage inputs, may be common between all delay elements in the first delay line. The first delay output may be generated based on these inputs, as discussed above with respect to FIGS. 3 and 4.

The first delay line may be on an integrated circuit. The integrated circuit may be implemented using Negative Metal Oxide Silicon (NMOS), Complementary Metal Oxide Silicon (CMOS), bipolar or one or more other technologies.

At block 820, a second delay output is generated. The first delay output may be generated by a second delay line. The first delay line may include m+n delay elements, where m is as described above with respect to block 810 and n is an integer greater than 0. The delay elements of the second delay line may have the characteristics of the delay elements described above with respect to block 810. Further, each of the delay elements of the first delay line and of the second delay line may be identical; i.e., the two delay lines together may contain 2*m+n identical delay elements.

The inputs and outputs of the second delay line (and of the individual delay elements of the second input line) may share the characteristics of the inputs and outputs of the first delay line discussed above with respect to block 810.

The two delay lines may be part of a compensation circuit, such as described above with respect to FIGS. 1-4 and 6. The second delay line and/or the compensation circuit may be on an integrated circuit, such as described above with respect to block 810.

At block 830, an offset pulse may be generated based on the first delay output and the second delay output. For example, the offset pulse may be generated based on performing an XOR operation on the first delay output and the second delay output. The output of the XOR operation may be filtered. For example, the XOR output may be NAND'd with either the first delay output or the second delay output and then inverted, effectively AND'ing the XOR output and the chosen delay output.

At block 840, a delay measure may be generated based on the offset pulse. The delay measure may be based on determining a width or duty cycle of the offset pulse averaged over time. The delay measure may then be the average voltage of the offset pulse, perhaps provided as one or more currents and/or voltages. The voltages may be direct current (DC) voltages. A delay-measure circuit may be used to generate the delay measure from an input offset pulse. The delay measure may be determined relative to a reference voltage. The delay-measure circuit may be ratiometric and/or include an differential amplifier.

By generating the delay measure based on the first and second offset pulses as described above, the delay measure may be a current or voltage corresponding to a process, voltage, and temperature (PVT) compensation for the reference clock signal.

At block 850, the delay measure may be output to an application circuit. The application circuit may take the delay measure (either current or voltage) output from the compensation circuit. The delay measure may be input as one or more currents to PVT-compensate a input signal of the application circuit, such as described above with respect to the DQS signal of FIG. 5.

The application circuit may be a test application circuit, such as the example application circuit shown above with respect to FIG. 5, or a memory-bus driver, such as shown above with respect to FIG. 6. The application circuit may also or instead be any circuit that takes a clock signal as input, such as but not limited to one or more random access memories (RAMs) (e.g., a DRAM and/or an SDRAM), one or more processor circuits, one or more control circuits, and/or one or more timing circuits. The application circuit may use the example application circuit shown in FIG. 5 as a front end or back end to PVT-compensate respective input or output signals. Application circuits may pass through delay measure signals unchanged to permit daisy-chaining of PVT compensation to multiple application circuits. Many other types of application circuits are possible as well.

Conclusion

Exemplary embodiments of the present invention have been described above. Those skilled in the art will understand, however, that changes and modifications may be made to the embodiments described without departing from the true scope and spirit of the present invention, which is defined by the claims. It should be understood, however, that this and other arrangements described in detail herein are provided for purposes of example only and that the invention encompasses all modifications and enhancements within the scope and spirit of the following claims. As such, those skilled in the art will appreciate that other arrangements and other elements (e.g. machines, interfaces, functions, orders, and groupings of functions, etc.) can be used instead, and some elements may be omitted altogether. Further, many of the elements described herein are functional entities that may be implemented as discrete or distributed components, in conjunction with other components, and in any suitable combination and location.

The invention claimed is:

1. A circuit, comprising:
   one or more clock circuits;
   a first delay line configured to generate a first delay output, the first delay line comprising m delay elements, wherein m is an integer greater than 0;
   a second delay line configured to generate a second delay output, the second delay line comprising m+n delay elements, wherein n is an integer greater than 0, and wherein the first delay line and the second delay line receive a reference clock signal from at least one of the one or more clock circuits;
   a delay-measure circuit configured to:
      generate an offset pulse based on the first delay output and the second delay output;
      generate a delay measure based on the offset pulse; and
      output the delay measure; and
   an application circuit configured to:
      receive the delay measure and at least one input signal, wherein the at least one input signal is different from the reference clock signal;
      adjust the at least one input signal based on the delay measure to generate at least one output signal; and
      output the at least one output signal.

2. The circuit of claim 1, wherein the delay-measure circuit comprises an exclusive-or (XOR) circuit and wherein the delay-measure circuit is configured to generate the offset pulse via using the XOR circuit to combine the first delay output and the second delay output.

3. The circuit of claim 1, wherein the delay-measure circuit is configured to generate the delay measure via determining a width of the offset pulse.

4. The circuit of claim 3, wherein the delay-measure circuit is configured to generate the delay measure via filtering the width of the offset pulse.

5. The circuit of claim 4, wherein the delay measure circuit is configured to filter the width of the offset pulse via taking an average voltage of a number of offset pulses generated over time.

6. The circuit of claim 5, wherein the delay measure comprises the average voltage of the number of offset pulses.

7. The circuit of claim 1, wherein at least one of the one or more clock circuits receives an external clock signal.

8. The circuit of claim 1, wherein the circuit is implemented using one or more process technologies selected from the group consisting of Complementary-Metal-Oxide Semiconductor (CMOS), Negative Metal Oxide Silicon (NMOS), and bipolar junction (BJT) processing technologies.

9. The circuit of claim 1, wherein each of the m delay elements of the first delay line and each of the m+n delay elements of the second delay line are identical.

10. The circuit of claim 1, wherein each of the m delay elements of the first delay line and each of the m+n delay elements of the second delay line include a delay buffer.

11. The circuit of claim 10, wherein each of the delay buffers comprises at least two current-starved inverters.

12. The circuit of claim 1, wherein the application circuit comprises one or more delay elements.

13. The circuit of claim 12, wherein the one or more delay elements of the application circuit are the same as each of the m delay elements of the first delay line and each of the m+n delay elements of the second delay line.

14. The circuit of claim 12, wherein to adjust the at least one input signal based on the delay measure to generate the at least one output signal, the application circuit is configured to use the one or more delay elements of the application circuit and the at least one input signal and the delay measure to generate the at least one output signal, such that the at least one output signal comprises a process, voltage, and/or temperature (PVT)-compensated version of the at least one input signal.

15. The circuit of claim 1, wherein the delay-measure circuit is configured to generate the offset pulse and the delay measure continuously.

16. The circuit of claim 1, wherein the input signal comprises one of a clock signal and a data strobe signal.

17. A method, comprising:
  receiving a reference clock signal;
  generating a first delay output using a first delay line comprising m delay elements, wherein m is an integer greater than 0 based on the received reference clock signal;
  generating a second delay output using a second delay line comprising m+n delay elements based on the received reference clock signal, wherein n is an integer greater than 0;
  generating an offset pulse based on the first delay output and the second delay output;
  generating a delay measure based on the offset pulse;
  receiving at least one input signal, wherein the at least one input signal is different from the reference clock signal;
  adjusting the at least one input signal based on the delay measure to generate at least one output signal; and
  outputting the at least one output signal.

18. The method of claim 17, further comprising outputting the generated delay measure to an application circuit.

* * * * *